US009147755B1

(12) United States Patent
Han et al.

(10) Patent No.: US 9,147,755 B1
(45) Date of Patent: Sep. 29, 2015

(54) NANOSTRUCTURE-BASED VACUUM CHANNEL TRANSISTOR

(71) Applicant: The United States of America as represented by the Administrator of the National Aeronautics & Space Administration (NASA), Washington, DC (US)

(72) Inventors: Jin-Woo Han, San Jose, CA (US); Meyya Meyyappan, San Jose, CA (US)

(*) Notice: Subject to any disclaimer, the term of this patent is extended or adjusted under 35 U.S.C. 154(b) by 0 days.

(21) Appl. No.: 14/249,238

(22) Filed: Apr. 9, 2014

Related U.S. Application Data

(60) Provisional application No. 61/826,419, filed on May 22, 2013.

(51) Int. Cl.
| | | |
|---|---|---|
| H01L 21/00 | (2006.01) | |
| H01L 29/66 | (2006.01) | |
| H01L 29/78 | (2006.01) | |
| H01L 29/417 | (2006.01) | |
| H01L 29/49 | (2006.01) | |
| H01L 29/423 | (2006.01) | |
| H01L 21/28 | (2006.01) | |
| H01L 21/3215 | (2006.01) | |
| H01L 21/02 | (2006.01) | |

(52) U.S. Cl.
CPC .... *H01L 29/66977* (2013.01); *H01L 21/02606* (2013.01); *H01L 21/28026* (2013.01); *H01L 21/3215* (2013.01); *H01L 29/41725* (2013.01); *H01L 29/42376* (2013.01); *H01L 29/49* (2013.01); *H01L 29/78* (2013.01)

(58) Field of Classification Search
CPC .................................................. H01L 21/02606
USPC ....................................................... 438/20, 962
See application file for complete search history.

(56) References Cited

U.S. PATENT DOCUMENTS

| 7,545,179 | B2 * | 6/2009 | Diamant et al. | 326/111 |
| 7,646,149 | B2 * | 1/2010 | Naaman et al. | 313/542 |
| 8,263,964 | B2 * | 9/2012 | Yu et al. | 257/9 |
| 8,748,950 | B2 * | 6/2014 | Levy et al. | 438/151 |

OTHER PUBLICATIONS

Chung, et al., Deep-Submicrometer MOS Device Fabrication Using a Photoresist-Ashing Technique, Electron Device Letters, Apr. 1988, 186-188, 9-4, IEEE Journals & Magazines.

Brodie, Physical Considerations in Vacuum Microelectronics Devices, Transactions on Electron Devices, Nov. 1989, 2641-2644, 36-11, IEEE.

Driskill-Smith, et al., Nanoscale field emission structures for ultra-low voltage operatio . . . , Applied Physics Letters, Nov. 24, 1997, 3159-3161, 71-21, AIP Publishing.

* cited by examiner

*Primary Examiner* — Chandra Chaudhari
(74) *Attorney, Agent, or Firm* — John F. Schipper; Robert M. Padilla

(57) ABSTRACT

A vacuum field effect, nanostructure-based transistor (VFET) that operates at pressures as high as 101 kPa, with an operating voltage magnitude as low as about 2 Volts and has a cutoff frequency as high as 0.46 THz, and has an electrode separation gap distance of about 150 nm or less.

10 Claims, 9 Drawing Sheets

NANOSTRUCTURE-BASED VACUUM CHANNEL TRANSISTOR

ORIGIN OF THE INVENTION

This invention was made by employees of the United States Government and may be manufactured and used by or for the Government of the United States of America for governmental purposes without the payment of any royalties thereon or therefore.

FIELD OF THE INVENTION

This invention relate to construction of a nanoscale transistor that operates in a vacuum transport channel.

BACKGROUND OF THE INVENTION

Charged particle carrier transport in a conventional solid state transistor is dominated by a drift-diffusion mechanism, with an associated transport velocity limit of about $5 \times 10^7$ cm/sec. A vacuum channel, when constructed, will rely upon thermionic emission and quantum tunneling, with a theoretical ballistic transport velocity of about $3 \times 10^{10}$ cm/sec. In conventional semiconductor action, electrons are scattered, and high temperature operation often results in reduction of drive current. Electrons in vacuum can move with few or no collisions, thereby increasing average electron velocity.

A conventional solid state semiconductor transistor does not perform well in extreme environments, such as very high temperature and/or where radiation is present. Vacuum devices offer immunity to radiation, increased robustness and relatively high frequency. A vacuum channel transistor might operate ballistically for carrier transport, if some operating conditions can be modified. However, this would require use of smaller transport distances, among other characteristics.

Early electronics centered use of a vacuum tube to amplify, switch, or modulate electrical signals. Many decades ago, vacuum tubes were replaced by solid-state devices such as the metal-oxide-semiconductor field-effect transistor (MOSFET) and diode. Nevertheless, vacuum tubes are still used in niche applications such as premier sound systems and high-power radio base stations.

The transition from the vacuum tube to the solid-state device was not driven by the superiority of the semiconductor as a carrier transport medium, but by the ease of fabrication, low cost, low-power consumption, lightness, long lifetime, and ideal form factor for integrated circuits (ICs). The vacuum tubes were fabricated by mechanical machining and used as discrete components, whereas modern solid-state devices are batch processed in assembling the integrated circuits. The vacuum device is more robust than solid-state devices in extreme environments involving high temperature and exposure to radiation. The critical tradeoff is that vacuum tubes yield higher frequency/power output but consume more energy than MOSFETs. Transport in a vacuum is intrinsically superior to transport in a solid medium, because vacuum transport allows ballistic transport while solid state carriers suffer from optical and acoustic phonon scattering in semiconductors.

Charged particle carrier transport in a conventional solid state transistor is dominated by a drift-diffusion mechanism, with an associated transport velocity limit of about $5 \times 10^7$ cm/sec. A vacuum channel, when constructed, will rely upon thermionic emission and quantum tunneling, with a theoretical ballistic transport velocity of about $3 \times 10^{10}$ cm/sec.

Cathodes of conventional vacuum tubes need to be heated for thermionic emission of electrons, and the energy for heating adversely overwhelms the energy required for field emission. A conventional vacuum device is, therefore, not suitable for low power devices. For high power amplification (e.g., >50 W), however, the solid state device needs a complex circuit architecture including many transistors, microstrips, and thermal management systems.

Advantages of both devices can be achieved together if the macroscale vacuum tube is miniaturized to a nanometer scale. A nano-vacuum tube can provide high frequency/power output while satisfying the metrics of low mass, small size, modest cost, lifetime, and stability in harsh conditions.

More importantly, further downscaling can allow use of a cold cathode, because the electric field itself is strong enough to emit electrons. Also, an ultimate downscaling combined with low work function materials may decrease the turn-on gate voltage and drain voltage to less than 1 Volt, thus enabling these devices to be competitive with modern semiconductor technology. These benefits can be attained by use of matured IC technology to fabricate nano scale vacuum tubes and to facilitate circuit integration.

The most common design of vacuum microelectronics is a vertical field emitter consisting of the emitter, gate, and collector. The emitter is a sharp conical tip, the gate is a circular aperture, and the collector is flapped at the top. The movement of electrons between the emitter (cathode) and the collector (anode) is controlled by the gate.

An array of vertical field emitters forms a large-area flat electron source. Unfortunately, the vertical structure may be undesirable for circuit implementation due to the difficulties in achieving geometrical dimensions with identical gap spacing over all devices on the substrate. In contrast, the geometry of a planar structure is defined by photolithography enabling practical integration.

However, as the distance between the emitter and the gate shrinks, processing becomes difficult. In addition, a fraction of the emitted electrons can be easily swept into the gate, and electrons at the gate can be emitted to the collector, both of which are detrimental in circuit design.

SUMMARY OF THE INVENTION

The invention meets these needs and deficiencies by providing a nanoscale, gate-insulated, planar, lateral triode with reduced gate leakage current. A separation between the emitter and collector is reduced to less than a lithographic limit (presently about 180 nm), using photoresist ashing to achieve a spacing of between 100 and 150 nm, and can be further decreased well below 100 nm, estimated to be as low as 10 nm. When this separation distance becomes less than the mean free path for electrons, the vacuum requirement becomes relaxed so that operation at near-atmospheric pressures becomes possible. Turn-on voltage for field emission is reduced to a value less than 2 Volts, which is less than the ionization energy of molecules in air. In one embodiment, silicon is degeneratively doped with ion implantation (e.g., phosphorous, arsenic and/or antimony), with a doping value $\approx 10^{20}$ cm$^{-3}$, and ions are activated by rapid thermal annealing at T=1000° C. for about 10 sec. At least two different emitter shapes, sharp/concave and rounded/convex, can be used with the reduced electrode separation.

The vacuum channel transistor relies on Fowler-Nordheim thermionic emission and on quantum tunneling. When the gate voltage is less than the turn-on voltage, a few electrons are emitted over the barrier with approximately thermal energy. When the vacuum energy level is greater than the turn-on voltage, the vacuum energy curve bends downward and allows electron tunneling through the narrow nominal barrier, as illustrated in FIGS. 4A and 4B. The turn-on voltage is taken to be the voltage value required to provide an electrical field of 1 Volt/μm adjacent to an electrode tip.

DESCRIPTION OF THE INVENTION

Figure 1:
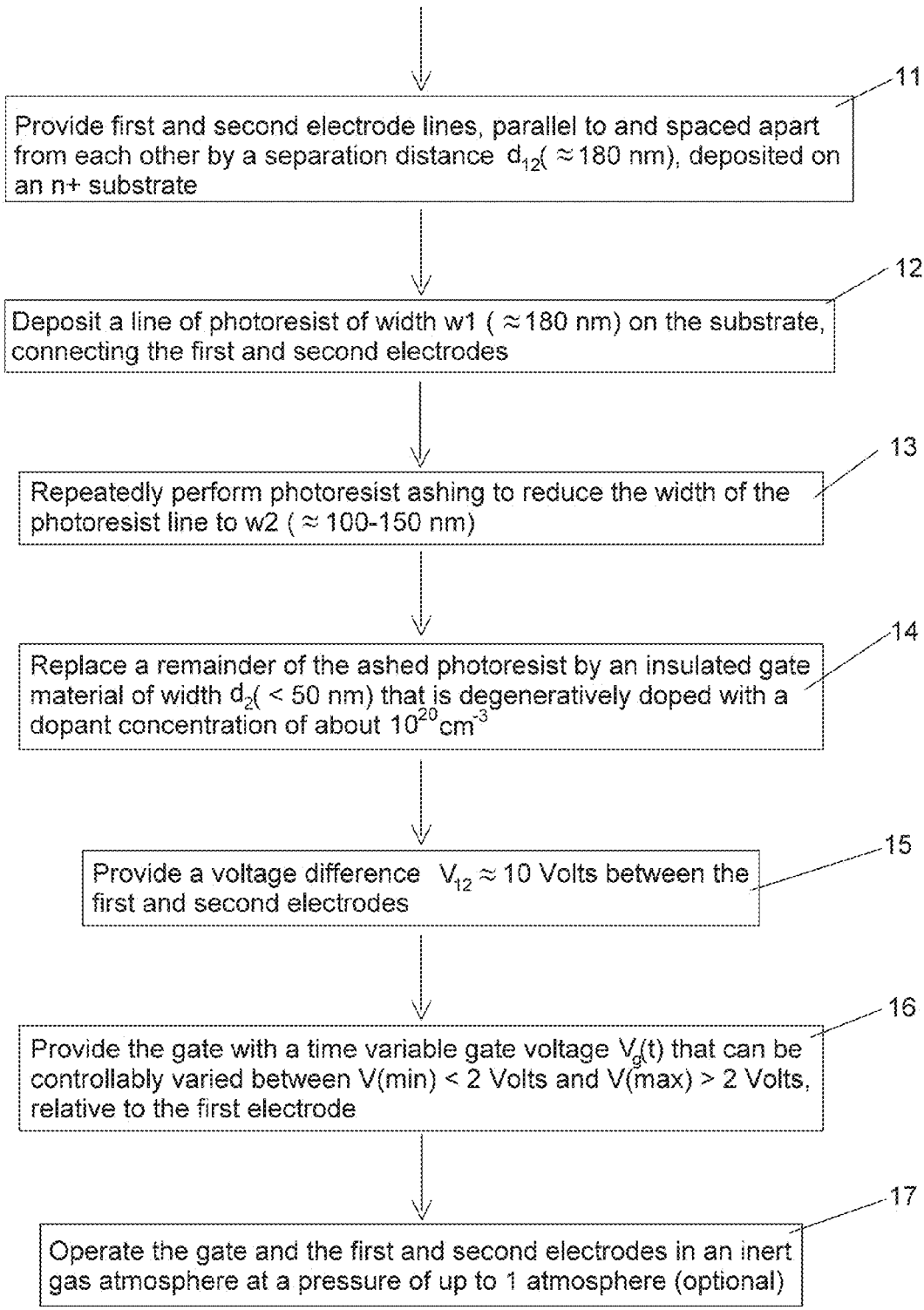
FIG. 1 is a flow chart of a procedure for practicing an embodiment of the invention.

FIG. 1 is a flow chart illustrating a method for constructing the invention. In step 11 first and second electrode lines are provided, having lengths $L_{e1}$ and $L_{e2}$ of length about 25 nm, parallel to each other and spaced apart by a separation distance $d_{12}$ of about 180 nm, deposited on an n+ type substrate. In step 12, a line of photoresist, of width w1 about 180 nm, is deposited on the substrate connecting the first and second electrodes. In step 13, photoresist ashing is repeatedly performed to reduce the photoresist line width to w2 of about 100-150 nm, illustrated in FIGS. 5A-5D. In step 14, a remainder of the ashed photoresist is replaced by an insulated gate material (optionally planar or cylindrical) of width $d_3$ less than 50 nm. Optionally, the gate material is degeneratively doped with an element such as P, As, Sb, B, Al, Ga, In or at least one metal, with a dopant concentration $\approx 10^{20}$ cm$^{-3}$. In step 15, the first and second electrodes are provided with a voltage difference of no more than about 10 Volts. In step 16, the gate is provided with a variable gate voltage that can be controllably varied between V(min)<2 Volts and V(max)>2 Volts, relative to the first electrode; in one embodiment, the turn-on gate voltage can be reduced to about 1 Volt. In step 17 (optional), the electrodes and gate are operated in an inert gas atmosphere (e.g., Ne, Ar, Kr, Xe and/or $N_2$) in a pressure chamber with a pressure of up to about 1 atmosphere (p≈101 kPa), or even higher.

Optionally, the electrode-electrode separation can be reduced to between 10 nm and 100 nm, with a corresponding reduction in gate width so that the gate is spaced apart from each of the first and second electrodes. Optionally, at least one of the electrodes can be a planar surface. Optionally, the gate may be planar or cylindrical, with one or more apertures to admit and control transport of the charged particles (mostly electrons).

Optionally, one or both of the electrodes can be shaped as a cusp, with a cusp apex (pointed or rounded) for one electrode being oriented toward the gate. Optionally, the gate may provide at least one gate aperture that is positioned adjacent to at least one cusp apex on at least one electrode. Optionally and preferably, where a cusp-shaped electrode is used, the cusp apex, which would usually be sharp and concave, is replaced by a cusp apex that is rounded and convex, in order to limit cusp breakdown at or near the cusp apex. These configurations permit a cut-off frequency as high as about 0.46 THz for electrode-electrode separation of 150 nm, increasing further as this separation decreases below 150 nm. This permits use of turn-on electrical field strength as low as 1 Volt/μm adjacent to a cusp apex.

Figure 2:
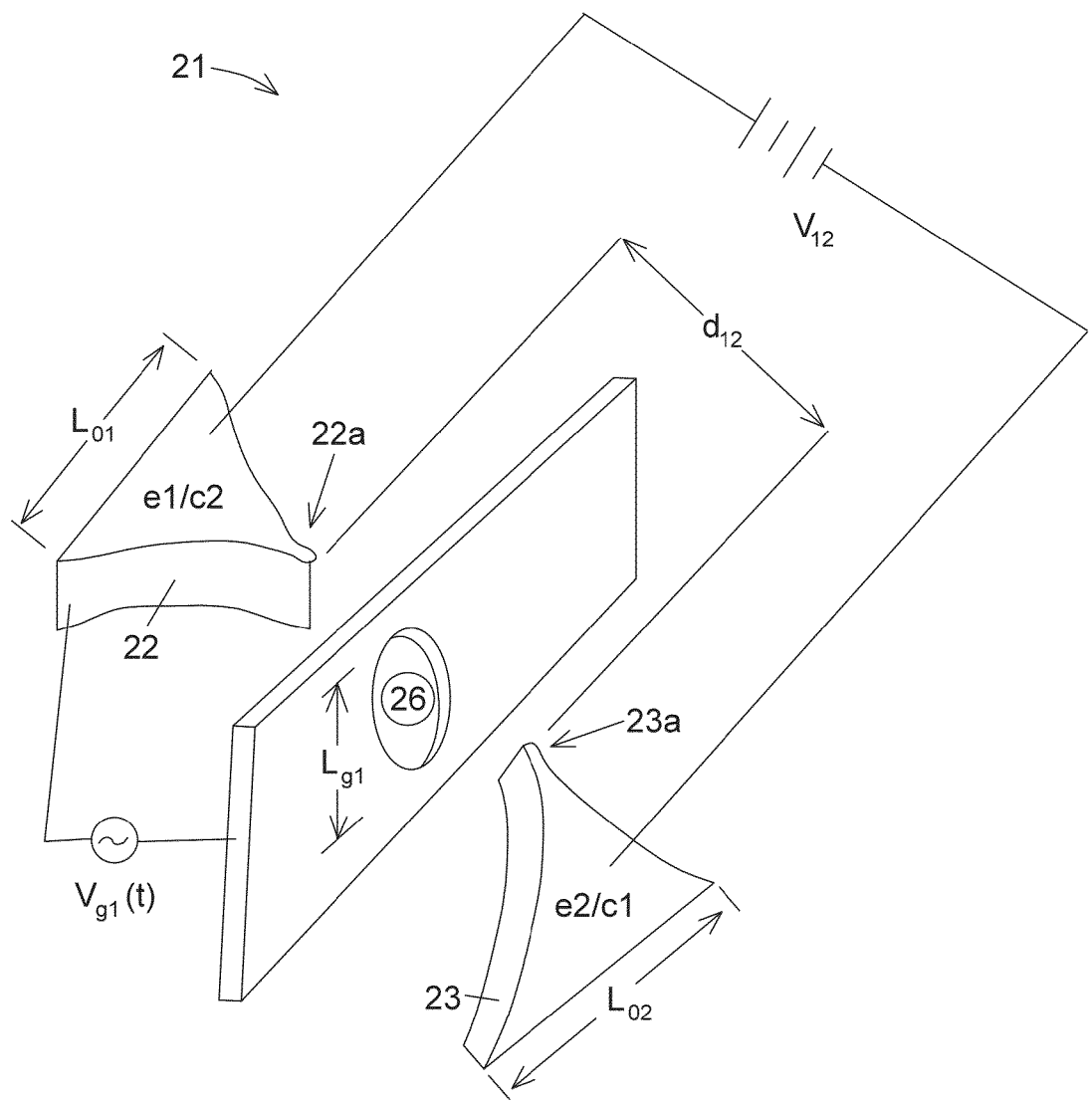
FIGS. 2 and 3 are schematic views of two embodiments of a system for practicing the invention.

FIG. 2 schematically illustrates one embodiment of a system 21 for practicing the invention. A first electrode 22 and a second electrode 23, both cusp shaped, with the cusp apices, 22a and 23a, oriented toward a gate 24, with an electrode-electrode distance of separation $d_{12}$. An insulated gate 24, comprising an approximately planar surface is positioned between the cusp apices, 22a and 23a, with at least one gate aperture positioned so that a line of sight between the two cusp apices passes through at least (one of) the gate aperture(s) 26. The gate aperture has a diameter $L_{g1}$ that is preferably no more than about one half the separation distance $d_{12}$. The two electrodes, 22 and 23, have a voltage difference $V_{12}$, which may be approximately constant, and the gate 24 has a time variable voltage $V_{g1}(t)$ relative to the electrode 22, or relative to the electrode 23. The electrodes, 22 and 23, can be operated as source and drain, respectively, or as drain and source.

Figure 3:
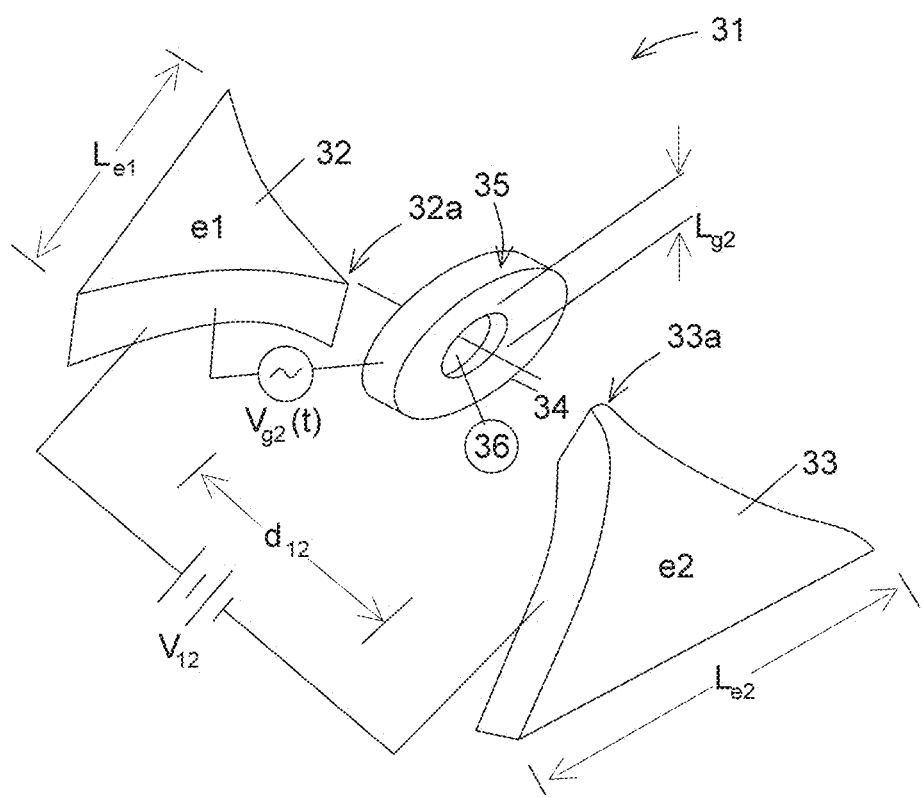

FIG. 3 schematically illustrates a second embodiment of a system 31, which is similar to the system 21, with similar first and second electrodes, 32 and 33, but with the planar gate 24 of FIG. 2 replaced by a gate 35 comprising an approximately planar surface with a cylindrical (or more generally oval) aperture 36. The aperture 36 has an axis whose line-of-sight connects or passes close to the apices, 32a and 33a. The cylindrical or oval aperture 36 has a diameter $L_{g2}$ that is preferably no larger than about one half the separation distance $d_{12}$. The gate 34 has a time varying voltage $V_{g2}(t)$ impressed thereon, relative to the first electrode 32 or relative to the second electrode 33, and the system 31 has an associated gate turn-on voltage with a value as low as about 2 Volts. In each of the embodiments 21 and 31, the system may be operated at a pressure up to about 1 atmosphere (101 kPa).

The distance between the emitter and the collector is less than the lithography limit, and is achieved by photoresist ashing. As the channel distance becomes less than the mean free path of electrons in air, the vacuum requirement itself is relaxed, and the field emission voltage is reduced to a value smaller than the ionization potential of molecules in air. As such, the present device can be referred to as the vacuum channel transistor even though it operates at atmospheric conditions.

A silicon-on-insulator wafer with a buried oxide (100 nm) and top silicon (120 nm) was the starting material, and the top silicon was thinned to 50 nm by thermal oxidation and removal. The silicon was degenerately doped ($\approx 10^{20}$/cm$^3$) with ion implantation using phosphorous, arsenic or antimony, and the ions were activated by rapid thermal annealing at 1000° C. for 10 sec. Next, the photoresist lines fanned out at both ends were defined by 193 nm KrF stepper. FIGS. 5(a)-5(d) show the scanning electron microscopy (SEM) images of the photoresist.

An initial line width of 180 nm was subsequently reduced by oxygen plasma treatment until the line was discontinued, forming two separated electrodes. This technique, referred to as resist trimming or thinning, is commonly used for reducing the line width, but we have utilized it here to terminate the line pattern. Because photoresist ashing reduces the photoresist isotropically, the ashing should be completed before its height is completely consumed, and therefore, the maximum ashing thickness should be less than the height of the resis. The height of the photoresist was fixed at 400 nm and, the width was varied according to the layout. In practice, ashing of about 150 nm was done so that lines with a width of under 300 nm were disconnected, with a height of 250 nm remaining. The remaining height guaranteed the etch selectivity tolerance between the photoresist and the silicon.

The distance between the electrodes can be varied by the layout and the ashing conditions. An initial line width of 180 nm was subsequently reduced by oxygen plasma treatment until the line was discontinued, forming two electrodes separated by a electrodes by a 150 nm gap. Although the limit of the optical lithography tool was 180 nm, a sub-lithographic width of 150 nm was achieved by the ashing. The geometrical factors of the emitter, such as aperture and radius, influence the performance and reliability. Two different shapes were assessed here: sharp concave tips and softened convex tips. The needle-like apex can be softened and rounded by thermal reflow of the photoresist. The sharp apex was rounded at 160° C. for 60 sec, and the top silicon was etched, followed by photoresist removal, leaving a rounded tip with a 14 nm radius of curvature.

Figures 4A, 4B:
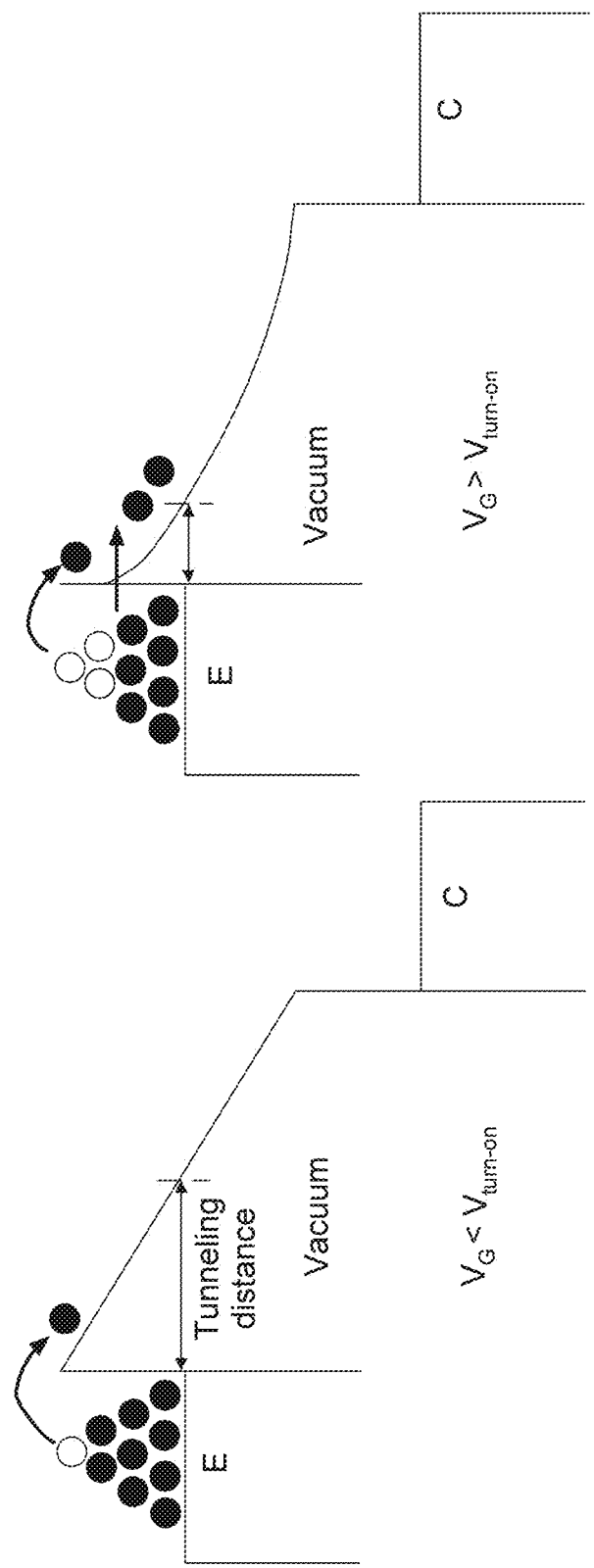
FIGS. 4A and 4B graphically illustrate energy band diagrams of a vacuum channel transistor for gate voltage less than, and greater than, turn-on voltage, respectively.
Figure 5A:
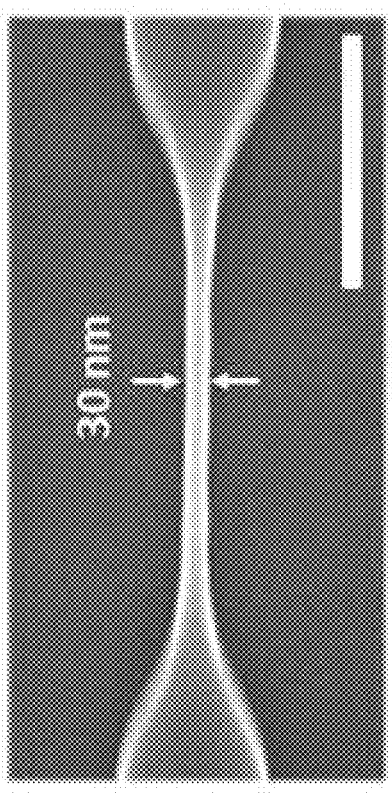
FIGS. 5A-5D illustrate scanning electron microscopy images for a vacuum channel transistor (VCFET), before and after photoresist ashing.
Figure 5B:
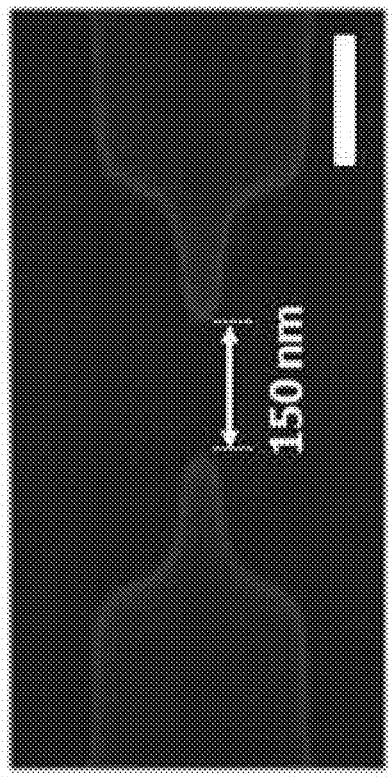
Figure 5C:
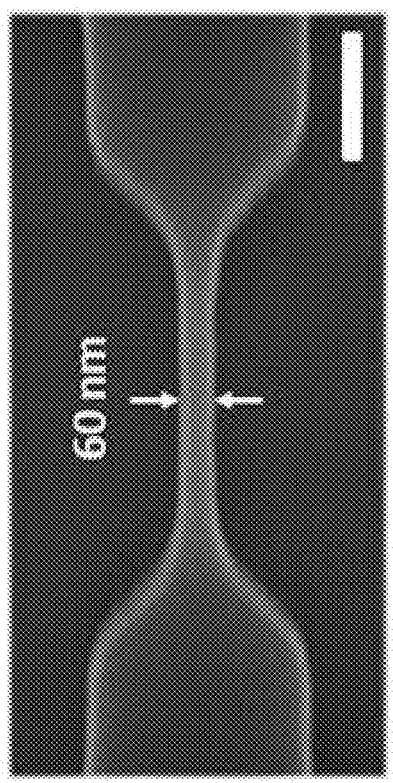
Figure 5D:
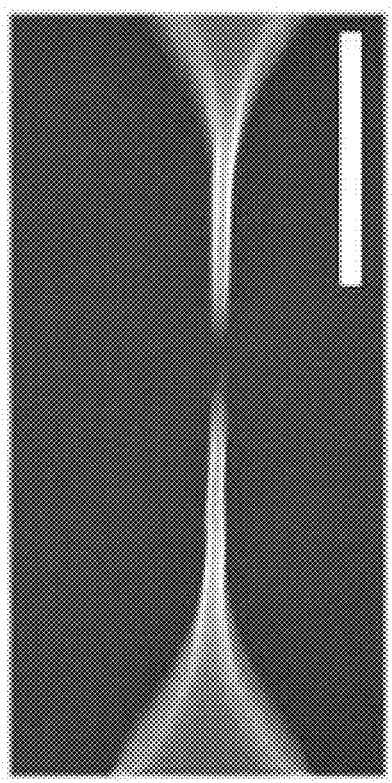

Whereas the carrier transport of solid-state transistors is dominated by a drift-diffusion mechanism, the vacuum channel transistor relies on thermionic emission and tunneling. FIGS. 4(a) and 4(b) show the energy band diagram of the vacuum channel transistor at on- and off-states. When the gate voltage is less than the turn-on voltage, some electrons are emitted over the barrier due to thermal energy, but the current is limited because the electrons surmounting the barrier are fewer than electrons at ground level. As the gate voltage increases above the turn-on voltage, the vacuum energy level bends downward, thus enabling electron tunneling through a narrow barrier and leading to an on-state of the device.

The field emission capabilities of both emitter shapes mentioned above can be compared in terms of the electric field around the tip. The sharp apex can present a stronger electric field than the rounded apex, because the electric field is intensified around a sharp corner, similar to a lightning antenna. Unfortunately, the sharp tips ruptured after a single measurement, which can be explained by local evaporation of the cathode. The higher electric field adjacent to the sharp tip involves larger discharge energy, and arcing can form craters or induce localized melting of silicon.

Figure 6A:
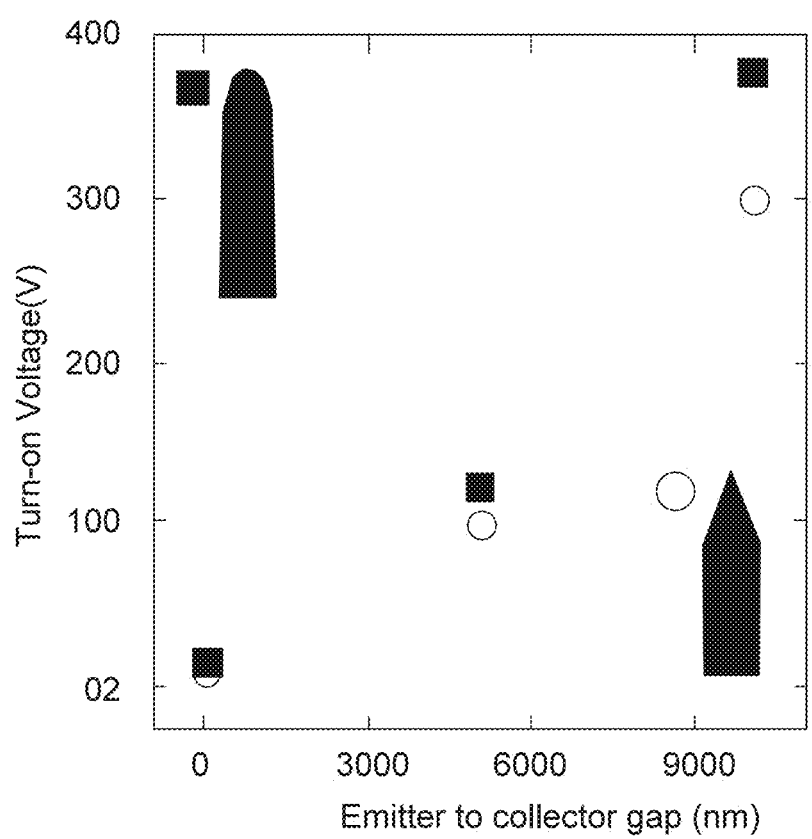
FIGS. 6A-6D graphically illustrate current-voltage characteristics and output characteristics of a VCFET and a MOSFET.

Therefore, use of a tip rounding process is essential, unless the material is reinforced to withstand high thermal and mechanical stresses. The field emission performance tends to degrade if the emitter tip becomes blunt, which can be mitigated as the spacing gets narrower. In order to elucidate the field emission performance, simulations were performed using COMSOL simulator for a set of face-to-face electrodes and two different shapes of the tips. FIG. 6(a) displays the computed turn-on voltage versus the spacing from the simulations.

The turn-on voltage is defined as the voltage required to obtain an electric field of 1 Volt/μm around the tip. As the spacing decreases, the turn-on voltages for the two types of tips converge. A simple electrostatic model supports the findings from the simulation. The field enhancement factor, β, is modeled with the tip radius and the distance between the emitter and the collector. A high β value enables low turn-on voltage and high emission current, and the model can provide an indication of how the design and size affect the performance.

The model suggests that β is proportional to $d^{-1}$ and to $r^{-1/2}$, where d is spacing and r is the radius of the emitter apex. A decrease in spacing increases β linearly, whereas a decrease in curvature increases β with a power of 0.5, which implies that space scaling may be more efficient than sharpening the tip. In other words, a blunt tip can be deployed if the transport space is sufficiently scaled down.

Figure 6B:
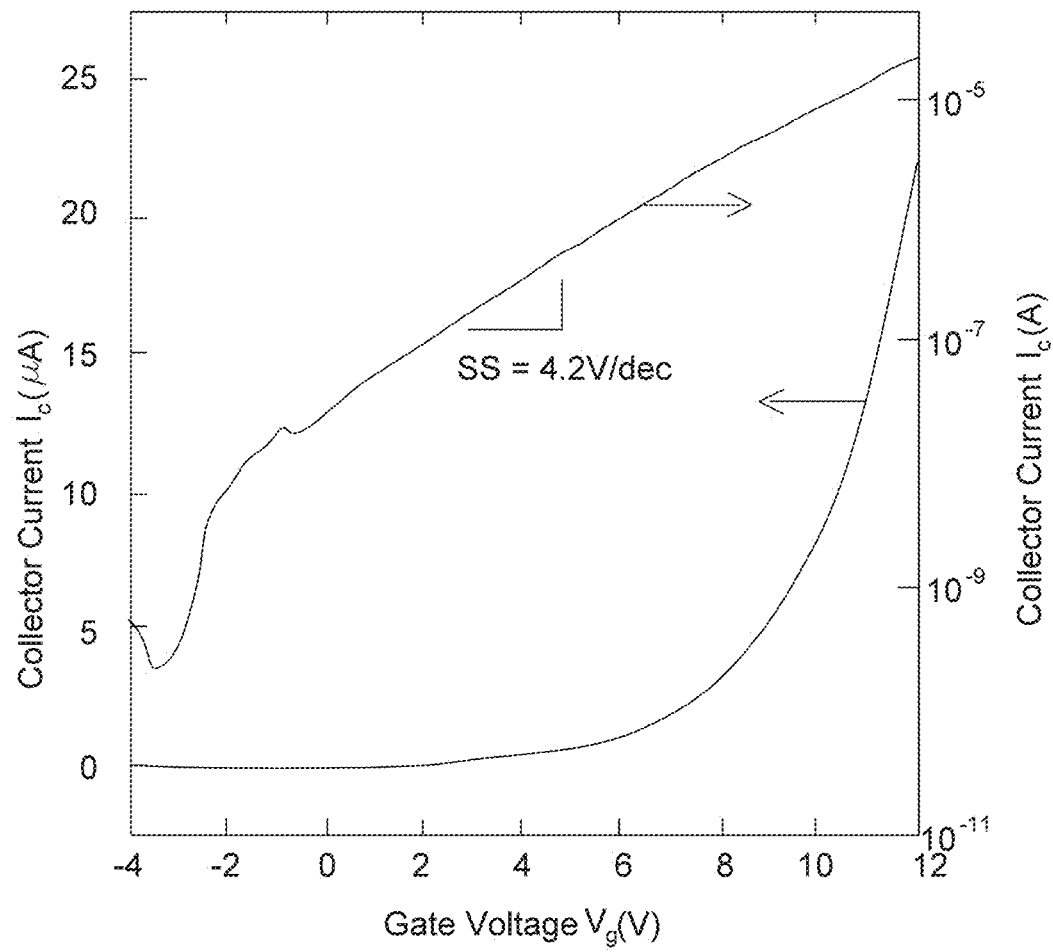
Figure 6C:
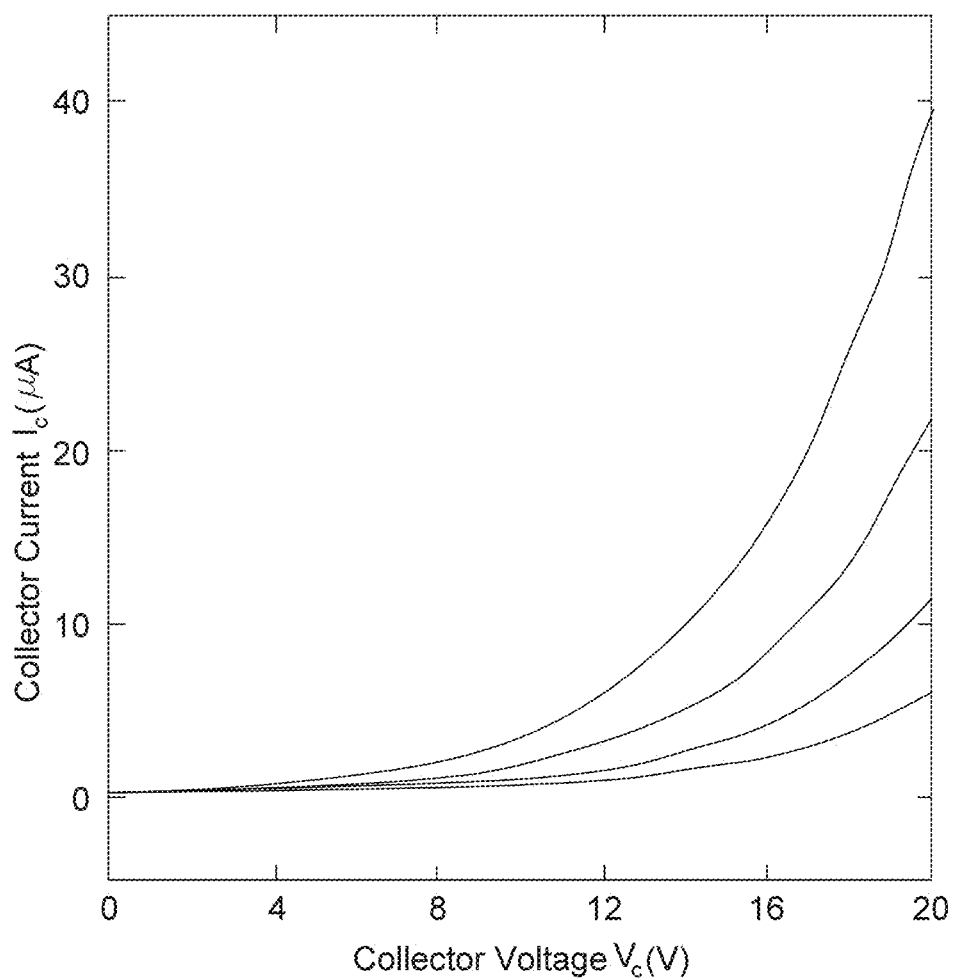

Characteristics of a vacuum channel transistor are analogous to characteristics of a solid-state transistor. At a given gate voltage $V_g$, the collector voltage $V_c$ triggers the field-emitted current $I_c$. FIGS. 6(b) and 6(c) show transfer ($V_g$ vs. $I_c$) and output ($V_c$ vs. $I_c$) characteristics, respectively. The threshold voltage obtained by linear extrapolation is around 8.9 Volts and the sub-threshold slope is 4.2 Volts/dec. The drive current is of the order of 10 μAmp, and the collector leakage current is the order of 10 pAmp. The on/off current ratio is $10^6$, and the measured transconductance ($g_m=dI_c/dV_g$) at $V_c=V_g=10$ Volts at 0.2 μS. Because of the ballistic transport in vacuum, the frequency response is simply limited by the transconductance and input capacitance.

The cut-off frequency ($f_t$) is $f_t=g_m/2\pi C_{ge}$, where $C_{ge}$ is gate to emitter capacitance. Because $C_{ge}$ is less than the measurement limit of the commercial LCR meter, the overlap capacitance between back-gate and emitter is estimated to be $C_{ge}=0.069$ aF for an emitter overlap area o 0.01 μm², and the cutoff frequency is estimated to be 0.46 THz.

During device operation, no electrons are emitted from the emitter until the $V_c$ reaches the turn-on voltage and $I_c$ increases exponentially with respect to $V_c$, according to Fowler-Nordheim tunneling theory. The output characteristic of a MOSFET is distinguished by a linear region at low drain voltage and a saturation region beyond the pinch-off condition.

Figure 6D:
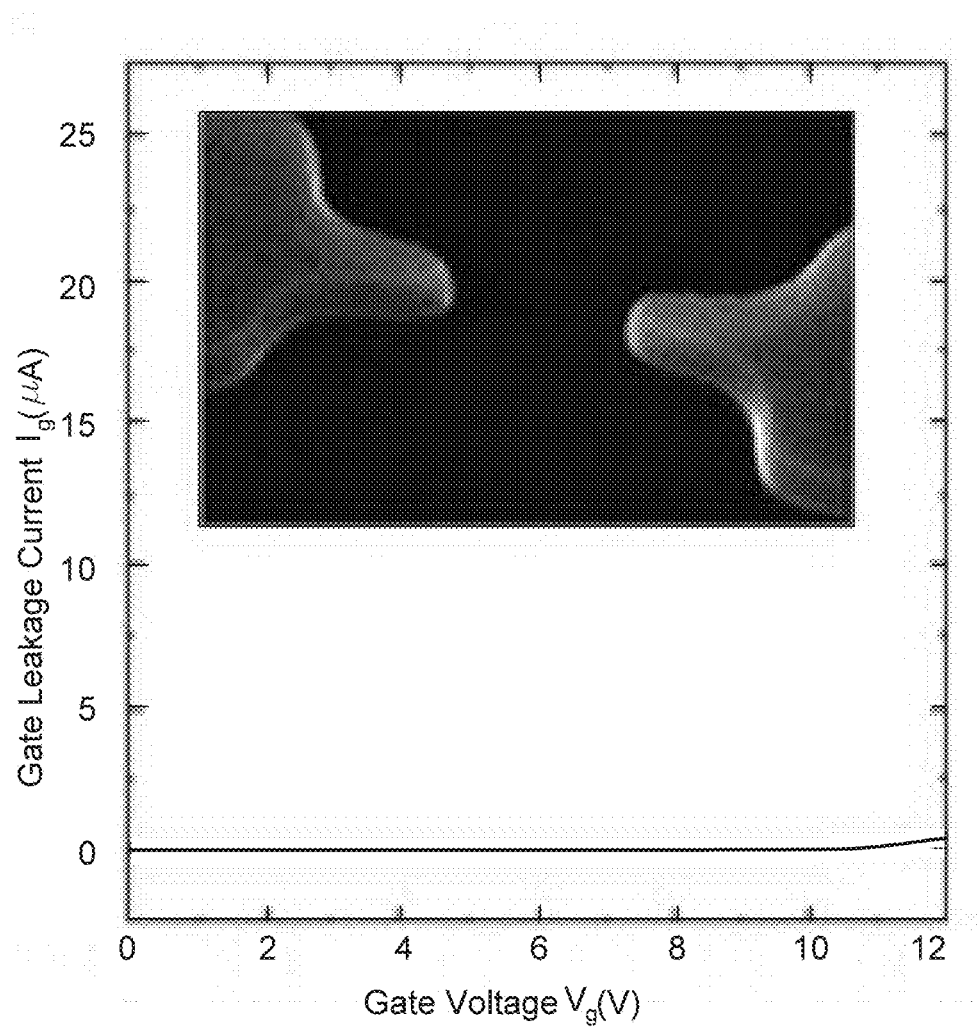

Similarly, the $I_c$-$V_c$ of vacuum devices can also be divided into two distinct regions, except that the $I_c$ versus $V_c$ has an exponential relation at low $V_c$ due to presence of Fowler-Nordheim tunneling. The saturation region is supposed to appear at higher $V_c$, but only the exponential region is displayed in FIG. 5(c) as the device was severely damaged at high voltages. In the present structure, a back-gate configuration was used so that the back-gate overlapped with the emitter. The gate-to-emitter overlap in conjunction with the thin insulator is very attractive because the overlap enhances the gate controllability while the insulator prevents parasitic gate leakage. The gate leakage current ($I_g$) was measured to be negligible as seen in FIG. 6(d), because of the gate insulator. A thinner gate insulator can obviously improve the gate field effect, and an ultra-thin buried oxide wafer has the potential of boosting the performance of the device.

In this work, the geometries of the emitter and collector are identical so that the point-to-point electron projection causes symmetrical $I_c$-$V_c$ characteristics in the forward and reverse biased regimes. This is undesirable in circuit design. The shapes of the emitter and the collector need to be point-to-plane configuration in order to obtain diode-like $I_c$-$V_c$ characteristics. Presence of symmetric electrode behaviors here result from the fact that the initial straight line was subjected to isotropic ashing.

The point-to-plane configuration could be attained from a trapezoidal shape, indicating the need for a further layout optimization. Although the measurements here were carried out at the individual device level, packaging techniques with vacuum encapsulation would enable implementation in practical applications.

In summary, a planar lateral air transistor was fabricated using standard silicon semiconductor processing. The emitter and collector were sub-lithographically separated by photoresist ashing, with the curvature of the tip controlled by the thermal reflow of the photoresist. The gap can be shrunk as small as 10 nm in the future using this process. Because the nanoscale gap separating the emitter and collector is smaller than the electron mean free path in air, vacuum is not needed.

The present structure exhibits superior gate controllability and negligible gate leakage current due to adoption of the gate insulator. The device has potential for high performance and low power applications. Because vacuum, as a carrier transport medium, is immune to high temperature and to radiation, the disclosed nano-transistors are ideal for extreme environment applications in military and space. Process and layout refinements, such as coating a low work function material on the emitter, reducing the overlap area and optimizing the oxide thickness can potentially improve the cut-off frequency well into the THz regime. THz frequency operation of the vacuum channel transistor would be useful for applications I hazardous chemical sensing, noninvasive medical diagnostics, and high-speed telecommunications.

What is claimed is:

1. A method for producing a vacuum field effect transistor, the method comprising:

providing first and second electrodes, approximately parallel, having lengths, $L_{e1}$ and $L_{e2}$, no greater than about 25 nm and 25 nm, respectively, and being separated by a positive gap distance $d_{12}$ that is no greater than about 150 nm, where each of the first and second electrodes is produced by plasma ashing of a line of photoresist having a selected line length no greater than about 20 nm, and where the first and second electrodes have a voltage difference $V_{12}$ that is non-zero and is no greater than about 10 Volts;

positioning an insulator gate, having a width $w_g$ that is no greater than about $d_{12}/2$ and having a gate length $L_g$ greater than a maximum of $L_{e1}$ and $L_{e2}$, between the first and second electrodes, where the gate is separated by an approximately equal distance from the first and second electrodes;

providing the gate with a variable gate voltage $V_g$ that can be controllably varied between $V_g(min) < 2$ Volts and $V_g(max) > 2$ Volts; and operating the first and second electrodes and the gate in an inert gas at a pressure up to about 101 kPa.

2. The method of claim 1, wherein said gate comprises at least one of a semiconductor material and a metal-like material, and the gate material is degeneratively doped with a selected doping element with a doping concentration of approximately $10^{20}$ cm$^{-3}$.

3. The method of claim 2, further comprising choosing said doping element to comprise at least one of the elements P, As, Sb, B Al, Ga, in and at least one metal.

4. The method of claim 1, further comprising providing said first and second electrodes with a separation gap $d_{12}$ in a range between 10 nm and 100 nm.

5. The method of claim 1, further comprising providing said transistor with a cut-off frequency at least equal to 0.46 THz.

6. The method of claim 1, further comprising operating said first and second electrodes and said gate in said inert gas at a pressure no more than about 1 kPa.

7. The method of claim 1, further comprising choosing said inert gas to comprise at least one of Ne, Ar, Kr, Xe, and $N_2$.

8. The method of claim 1, further comprising providing at least one of said electrodes with a cusp shape, having a cusp apex oriented toward said insulator gate.

9. The method of claim 1, further comprising providing at least first and second of said electrodes with first and second cusp shapes, respectively, with first and second cusp apices that face each other, providing said gate as a cylindrical surface having a cylinder aperture and having a longitudinal axis that passes through the cylinder aperture and through the first and second cusp apices.

10. The method of claim 1, further comprising providing at least first and second of said electrodes with first and second cusp shapes, respectively, with first and second cusp apices that face each other, and providing said gate as an approximately planar surface having a gate aperture that is located adjacent to the first and second cusp apices.

* * * * *